United States Patent [19]
Momodomi et al.

[11] Patent Number: 4,939,690
[45] Date of Patent: Jul. 3, 1990

[54] ELECTRICALLY ERASABLE PROGRAMMABLE READ-ONLY MEMORY WITH NAND CELL STRUCTURE THAT SUPPRESSES MEMORY CELL THRESHOLD VOLTAGE VARIATION

[75] Inventors: Masaki Momodomi, Yokohama; Riichiro Shirota, Kawasaki; Yasuo Itoh, Kawasaki; Satoshi Inoue, Kawasaki; Fujio Masuoka, Yokohama; Ryozo Nakayama, Yokohama; Ryouhei Kirisawa, Yokohama, all of Japan

[73] Assignee: Kabushiki Kaisha Toshiba, Kawasaki, Japan

[21] Appl. No.: 290,427

[22] Filed: Dec. 27, 1988

[30] Foreign Application Priority Data

Dec. 28, 1987 [JP] Japan .................. 62-329782
May 10, 1988 [JP] Japan .................. 63-111621

[51] Int. Cl.$^5$ ................ G11C 11/40; G11C 17/00
[52] U.S. Cl. ................... 365/185; 365/184; 365/238.5; 365/218; 357/23.5
[58] Field of Search .......... 365/185, 218, 94, 103, 365/104, 184, 186, 187, 238.5; 307/465; 357/23.5; 340/825.8, 825.9

[56] References Cited

U.S. PATENT DOCUMENTS

| | | | |
|---|---|---|---|
| 4,203,158 | 5/1980 | Frohman-Bent et al. | 365/185 |
| 4,233,526 | 11/1980 | Kurogi et al. | 357/23.5 |
| 4,467,453 | 8/1984 | Chiu et al. | 365/185 |
| 4,500,975 | 2/1985 | Shirato | 365/104 |
| 4,580,247 | 4/1986 | Adam | 365/185 |
| 4,648,074 | 3/1987 | Pollachek | 365/184 X |

FOREIGN PATENT DOCUMENTS

| | | | |
|---|---|---|---|
| 53-148256 | 12/1978 | Japan . | |
| 57-71587 | 5/1982 | Japan . | |
| 60-8559 | 3/1985 | Japan . | |
| 60-182162 | 9/1985 | Japan | 365/185 |
| WO84/02800 | 7/1984 | PCT Int'l Appl. . | |

OTHER PUBLICATIONS

R. Stewart et al., pp. 89–90, "A High Density EPROM Cell and Array", Symposium on VLSI technology digest of technical papers, May 1986.
IBM Technical DIsclosure Bulletin, vol. 24, No. 7B, Dec. 81, pp. 3811–3812, "Electrically Alterable Non-Volatile Logic Circuits" by Kotecha.

*Primary Examiner*—Stuart N. Hecker
*Assistant Examiner*—Alfonso Garcia
*Attorney, Agent, or Firm*—Oblon, Spivak, McClelland, Maier & Neustadt

[57] ABSTRACT

An erasable programmable read-only memory with NAND cell structure is disclosed which includes NAND cell blocks each of which has a selection transistor connected to a corresponding bit line and a series array of memory cell transistors. Each cell transistor has a floating gate and a control gate. Word lines are connected to the control gates of the cell transistors. In a data erase mode all the memory cells are simultaneously erased by applying a "H" level potential to the control gates of the memory cells and a "L" level potential to the bit lines. Prior to such a simultaneous erase, charges are removed from charge accumulation layers of the memory cells so that the threshold values of the memory cells are initialized. The threshold initialization is performed on the series-arrayed memory cell transistors in the NAND cell block in sequence.

15 Claims, 10 Drawing Sheets

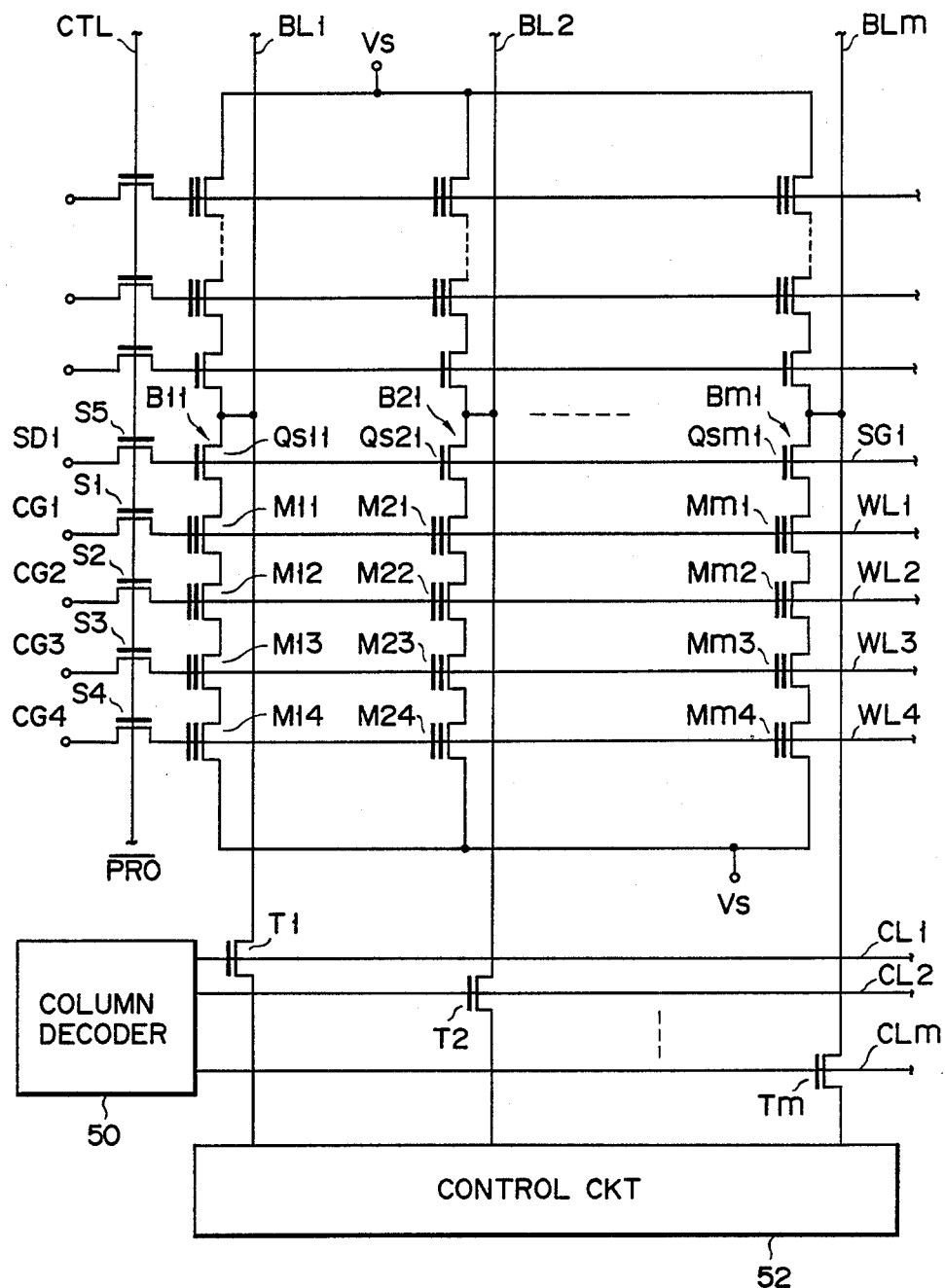
F I G. 1

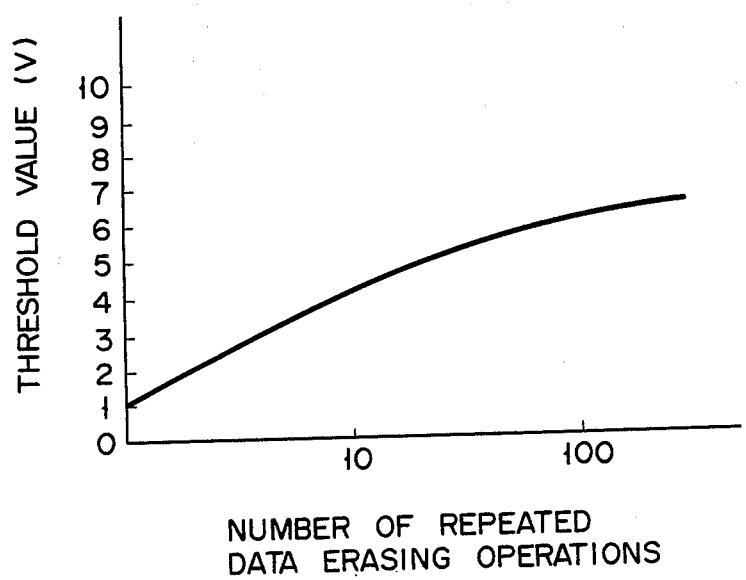
F I G. 6

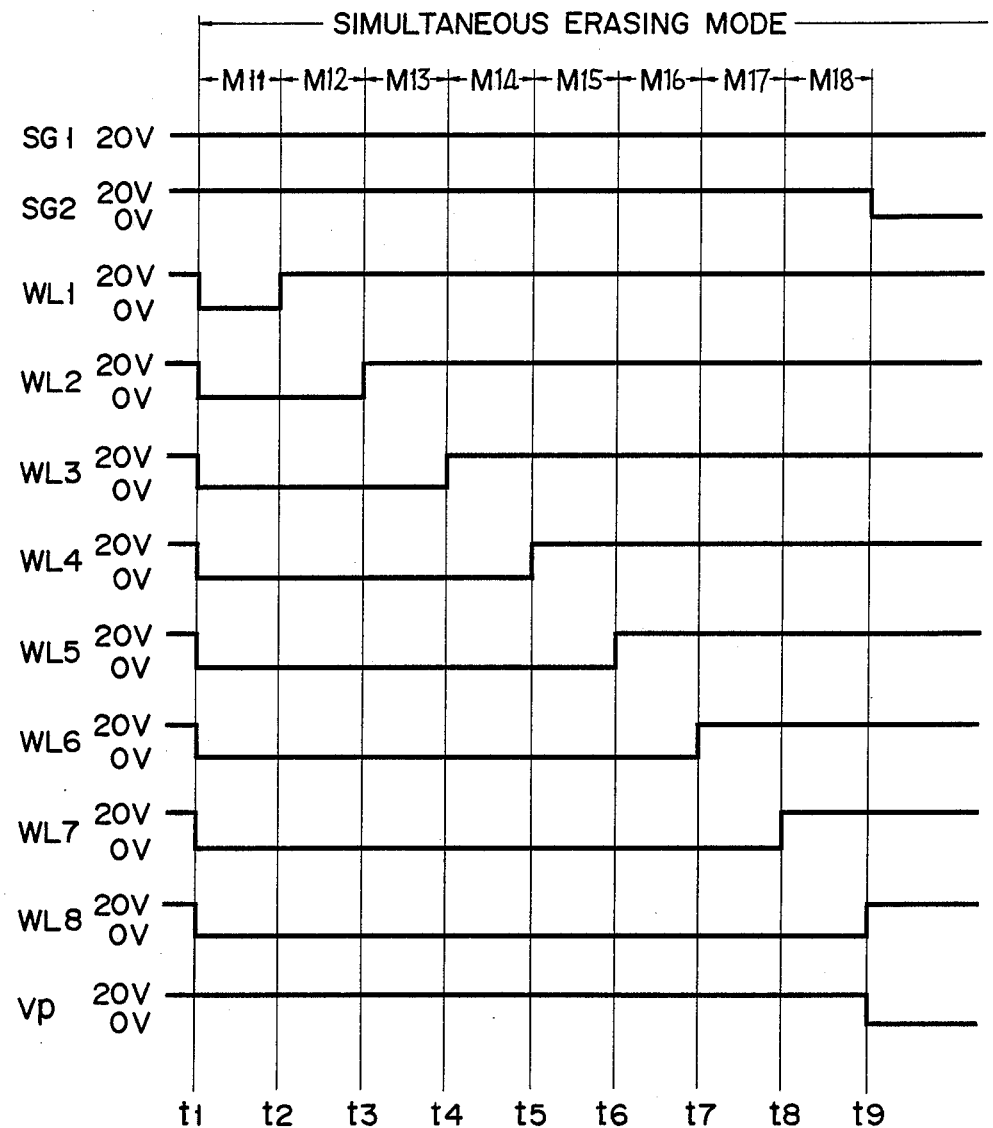
F I G. 11

ELECTRICALLY ERASABLE PROGRAMMABLE READ-ONLY MEMORY WITH NAND CELL STRUCTURE THAT SUPPRESSES MEMORY CELL THRESHOLD VOLTAGE VARIATION

BACKGROUND OF THE INVENTION

1. Field of the Invention

The present invention relates to non-volatile semiconductor memories and, more particularly, to electrically erasable programmable read-only memories with large storage capacity.

2. Description of the Related Art

With the increasing needs for high performance and reliability of digital computer systems, the development of a semiconductor memory has strongly been demanded that has enough storage capacity to replace an existing non-volatile data storage device, such as a magnetic floppy disk unit, for computers. As compared with magnetic disk storage devices, such as a floppy disk unit and a hard disk unit, a presently available electrically erasable programmable semiconductor read-only memory is reliable and fast in data writing/reading speed. However, the electrically erasable programmable semiconductor read-only memory is not still large in data storage capacity enough to replace the above magnetic data storage devices.

In a conventional electrically erasable programmable read-only memory (abbreviated to "EEPROM" hereinafter), each memory cell is typically composed of two transistors and data is randomly written or erased one byte at a time. Hence, such high-density integration of the EEPROM as provides large storage capacity enough to replace the peripheral data storage devices will be difficult to expect.

Recently, as a non-volatile semiconductor memory which is integrated at high density and thus has a large storage capacity, an erasable programmable read-only memory has been developed that has a "NAND type cell" structure. This type of memory device is typically designed such that: (1) each memory cell utilizes one transistor having a floating gate and a control gate; and (2) a single contact is provided between an array of memory cells arranged on a substrate to constitute an "NAND cell structure" and a corresponding bit line. Hence, as compared with the conventional EEPROM, the area occupied by memory cells can considerably be reduced and thus the integration density can be improved.

The NAND cell type EEPROM suffers, however, from low operational reliability. Writing data into a desired memory cell selected out of memory cells is performed by discharging charges from the floating gate of a double gate FET corresponding to the selected cell. Erasing data is simultaneously performed on all the memory cells (called "simultaneous erase"), in which case the floating gates of all the cell FETs are simultaneously injected with charges. When there is a memory cell which is not to be written into but to be erased in a NAND cell block, the threshold value of this cell gradually undesirably increases after repetition of the data erase operation. According to an experiment conducted by the present inventors, it was confirmed that the threshold value of the double gate FET of a memory cell that was initially one volt increased to four volts or more when the number of repetitions of the erase operation was 10 and to as high as six volts for 100 repetitions of the erase operation.

Such variation of the threshold value of a memory cell FET which has repeatedly been subjected to an erase operation only will cause NAND cell type EEPROM to fail. That is, according to this type of EEPROM, in a data read mode, a supply voltage VCC is applied to the control gates of nonselected memory cell FETs in a specific NAND cell block including a selected cell so that the nonselected cell FETs are rendered conductive, while ground potential VS is applied to the control gate of the selected memory cell FET so as to determine whether potential that appears on a corresponding bit line corresponds to a logic 1 or a logic 0. Under this condition, if the threshold value of the nonselected cell FETs has increased as described above, correct data readout would become difficult. If the threshold value of the nonselected cell FETs increased to the supply voltage VCC or more, these FETs no longer could be turned on by application of the supply voltage VCC thereto. Therefore, the NAND cell type EEPROM will fail in effective data readout.

SUMMARY OF THE INVENTION

It is accordingly an object of the present invention to provide a novel and improved non-volatile semiconductor memory.

It is another object of the present invention to provide a novel and improved electrically erasable programmable read only memory which is high-density integrated to have large storage capacity and has high operational reliability.

In accordance with the above objects, the present invention is addressed to a specific nonvolatile dynamic semiconductor memory device comprising: a semiconductive substrate; parallel bit lines formed over the substrate; and rewritable memory cells connected to the bit lines. The memory cells comprise NAND cell blocks each of which has a series array of memory cell transistors. Each of the transistors has a charge accumulation layer, such as a floating gate, and a control gate. Parallel word lines are provided over the substrate to intersect the bit lines and connected at their control gates to the transistors. Threshold initialization means is provided for performing auxiliary write operation on all the memory cells prior to the simultaneous erase in a erase mode of the memory device, so as to suppress or avoid undesirable incremental variation of the threshold values of the memory cell transistors. When a certain cell block including a selected memory cell is specified and the selected memory cell is repeatedly subjected to data rewrite operation, the threshold initialization means performs the auxiliary write operation on all the memory cells including the selected memory cell in the specified cell block in sequence, whereby charges are discharged from charge accumulation layers of the memory cells into the substrate so that the threshold values of the memory cell transistors are made equal to a fixed potential level.

The present invention and its objects and advantages will become more apparent from the detailed description of the preferred embodiments presented hereinafter.

BRIEF DESCRIPTION OF THE DRAWINGS

In the detailed description of preferred embodiments of the invention presented below, reference is made to the accompanying drawings of which:

FIG. 1 is a diagram showing principal part of a circuit arrangement of an electrically erasable programmable read-only memory according to a preferred embodiment of the invention;

FIG. 6 is a graph showing experimental data in which the threshold value of nonselected cells increases undesirably in repeating alteration of data in a selected memory cell;

FIG. 11 illustrates waveforms of main electrical signals appearing in main portions of the EEPROM of FIG. 9 at the time of auxiliary write operation (writing for preventing the threshold variation) carried out during the simultaneous erase mode of the EEPROM.

DETAILED DESCRIPTION OF THE PREFERRED EMBODIMENTS

Figure 2:
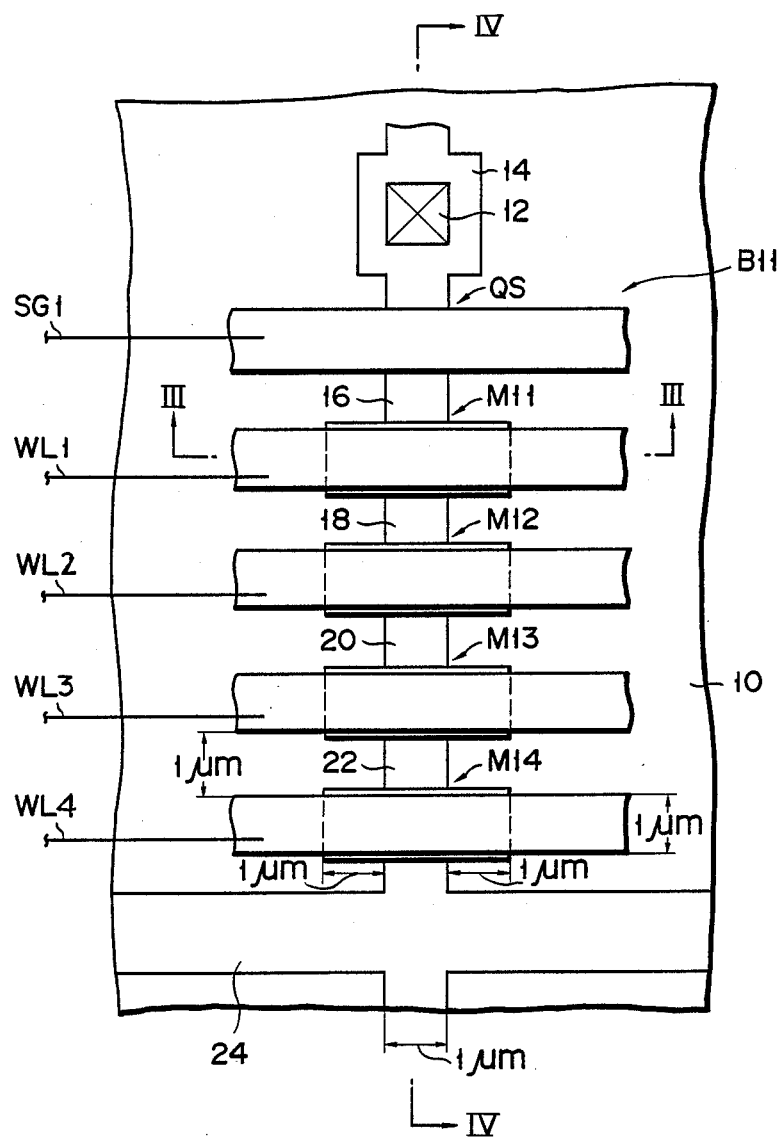
FIG. 2 is a plan view of a NAND cell block provided in the EEPROM of FIG. 1 and including memory cell transistors series connected with a selection transistor so as to constitute a NAND cell structure.

Referring now to FIG. 1, an electrically erasable programmable read-only memory according to a preferred embodiment of the present invention comprises an array of memory cells which is formed on a chip substrate 10 (see FIG. 2). A selected number of parallel bit lines BL1, BL2, ..., BLm are insulatingly formed over the chip substrate. A reference symbol "BLi" is used hereinafter to specify an arbitrary one of these bit lines. Each of these bit lines BLi is connected with a plurality of memory cells. The memory cells are divided into subarrays (referred to as "NAND cell blocks" or simply as "cell blocks" hereinafter) B11, B21, ... each of which has a selection transistor Qs and a selected number of memory cells M. Selection transistor Qs is formed of a single-gate MOSFET. Each of memory cells M is essentially formed of a double-gate MOSFET which has a floating gate and a control gate. In the circuit arrangement of FIG. 1, only NAND cell blocks B11, B21, ..., Bm1, which are connected to bit lines BL1, BL2, ..., BLm, respectively, are depicted in detail only for the purpose of simplifying illustration.

The transistor series connection of each NAND cell block Bi1 has one end (i.e., the drain of memory cell transistor M11) connected to the corresponding bit line BLi via first selection transistor Qsi1 and the other end (i.e., the source of memory cell transistor M14) grounded to substrate potential Vs. In this embodiment memory cells M of each cell block Bi1 are comprised of memory cell transistors Mi1, Mi2, ..., Min which are series connected to constitute the so-called "NAND cell" structure. In the following description the number "n" of the memory cell transistors in each cell block is set to as small as four only for the purpose of simplifying illustration. In practical application, however, the number of memory cell transistors will be eight or sixteen.

Parallel word lines WL1, WL2, ..., WL4 are insulatingly formed over the substrate so as to intersect bit lines BL at right angles. Selection transistors Qs and memory cell transistors M are placed at intersections of bit lines BL and word lines WL as shown, thereby forming a cell matrix. However, a line SG1 connected to selection transistor Qsi1 of each cell block Bi1 may be called a gate control line in this description.

As shown in FIG. 2, a NAND cell block (e.g. B11) has a contact hole 12 over lightly-doped P-type silicon substrate 10. More specifically, heavily-doped N type (N+ type) diffusion layers 14, 16, 18, 20, 22, 24 are formed discontinuously in the direction in which NAND cell block B11 extends. Gate control line SG1 and word lines WL1, WL2, WL3, WL4 are formed over substrate 10 perpendicular to the direction of arrangement of the N+ type layers, thereby defining selection transistor Qs1 and memory cells M11 through M14 of the said NAND cell block B11.

Figure 3:
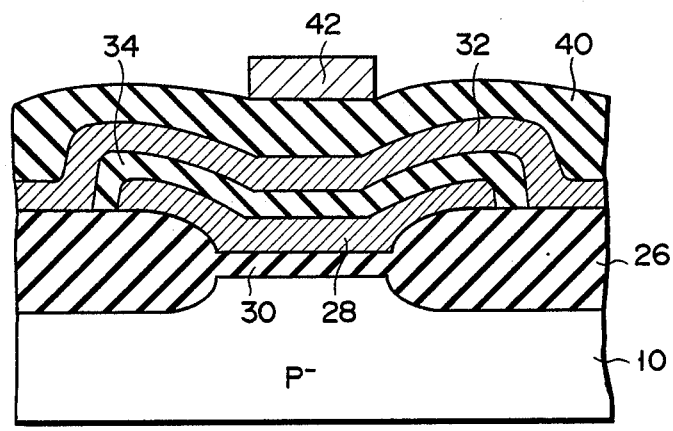
FIG. 3 is a sectional view of the NAND cell block of FIG. 2, taken along the line 3—3 of FIG. 2.
Figure 4:
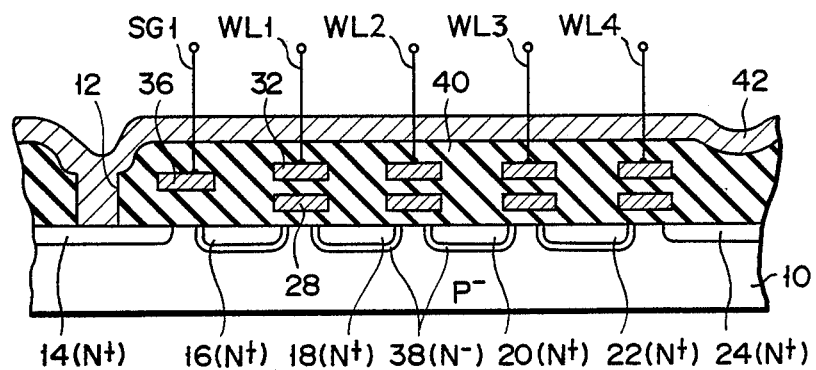
FIG. 4 is a sectional view of the NAND cell block of FIG. 2, taken along the line 4—4 of FIG. 2.

Referring to FIGS. 3 and 4, the transistor array of NAND cell block B11 is formed in a substrate surface area surrounded with an insulating layer 26 for device isolation formed on substrate 10. As most clearly shown in FIG. 3, MOSFET M11 constituting one memory cell has a first polysilicon layer 28 disposed over substrate 10 with a thermal oxide layer 30 interposed therebetween and a second polysilicon layer 32 disposed over layer 28 with a thermal oxide layer 34 interposed therebetween. First polysilicon layer 28 functions as the floating gate of MOSFET M11, whereas second polysilicon layer 32 functions as the control gate of MOSFET M11. The other memory cells have the same structure as described above.

Control gate layer 32 is connected to a corresponding word line (word line WL1 in the case of memory cell M11). As shown in FIG. 3, floating gate 28 is formed to overlap the device isolating region whereby coupling capacitance Cfs between floating gate 28 and substrate 10 is made smaller than coupling capacitance Cfc between floating gate 28 and control gate 32. This thus enables the data write/erase only by the utilization of the transfer of electrons between floating gate 28 and substrate 10 due to the tunnel effect. Selection transistor Qs11 has a polysilicon layer 36 insulatingly disposed over substrate 10. Polysilicon layer 36 serves as the control gate of selection transistor Qs11.

According to this embodiment, as shown in FIG. 2, both of the control gate and floating gate of each memory cell transistor have a width of 1 μm, and the channel width of each memory cell transistor is also set to 1 μm. The floating gate is protruded from both ends of a corresponding N+ layer by 1 μm. First gate insulating layer 30 is a thermal oxide layer of 20 nm thickness, whereas second gate insulating layer 34 is a thermal oxide layer of 35 nm thickness. Assuming the dielectric constant of these thermal oxide layers to be $\epsilon$, coupling capacitances Cfs and Cfc described above will be given by $$Cfs = \epsilon/0.2$$

$$Cfc = 3\epsilon/0.035$$

It will thus be understood that the NAND cell structure of this embodiment satisfies the above condition.

As shown in FIG. 4, N+ type diffusion layers 14, 16, 18, 20, 24 are formed in the surface portion of substrate 10 in such a way that they somewhat overlap the gates of transistors Qs and M. The N+ type diffusion layers serve as the source and drain of a corresponding transistor. For example, N+ diffusion layers 14 and 16 serve as the drain and source of selection transistor Qs11, respectively. Similarly, N+ diffusion layers 16 and 18 serve as the drain and source of cell transistor M11, respectively. As shown in FIG. 4, the N+ layers of memory cells M11 through M14 are each surrounded with a lightly doped N type (N-type) diffusion layer 38 except for the surface thereof, thereby increasing the surface breakdown withstand voltage.

The above layer structure is completely covered with a CVD insulating layer 40. A through hole is formed in CVD insulating layer 40 as shown so as to function as contact hole 12 for the series transistor array of cell block B11. An aluminum wiring layer 42 is deposited on CVD insulating layer 40, though not shown in the plan view of FIG. 2. Wiring layer 42 extends along the series connection of transistors Qs1 and M and overlies the gates of transistors Qs and M in cell block B11. Contact hole 12 is placed on source diffusion layer 14 of selection transistor Qs11. Aluminum wiring layer 42 runs on CVD insulating layer 40 and contact drain diffusion layer 14 of selection transistor Qs through contact hole 12. Wiring layer 42 is selectively connected to a data input line or a data output line.

Returning to FIG. 1, word lines WL1, WL2, WL3, WL4 are connected to control terminals CG1, CG2, CG3, CG4 via transistors S1, S2, S3, S4, respectively. Gate control line SG1 is connected to control terminal SD1 via transistor S5. Transistors S1 through S5 are connected at their gates to control line CTL which is supplied with a control signal $\overline{PRO}$.

Column control lines CL1, CL2, ..., CLm are formed over substrate 10 so as to intersect bit lines BL1, BL2, ..., BLm at right angles. MOSFETs T1, T2, ..., Tm are placed at intersections of these lines. The gates of these MOSFETs are connected to a column decoder 50 by column control lines CL1, CL2, ..., CLm. The MOSFETs are selectively rendered conductive under the control of column decoder 50. Bit lines BL are connected to a control circuit 52 via the MOSFETs. Control circuit 52 includes a voltage generating circuit section and a sense circuit section (not shown) and is connected to input and output lines (not shown).

Figure 5:
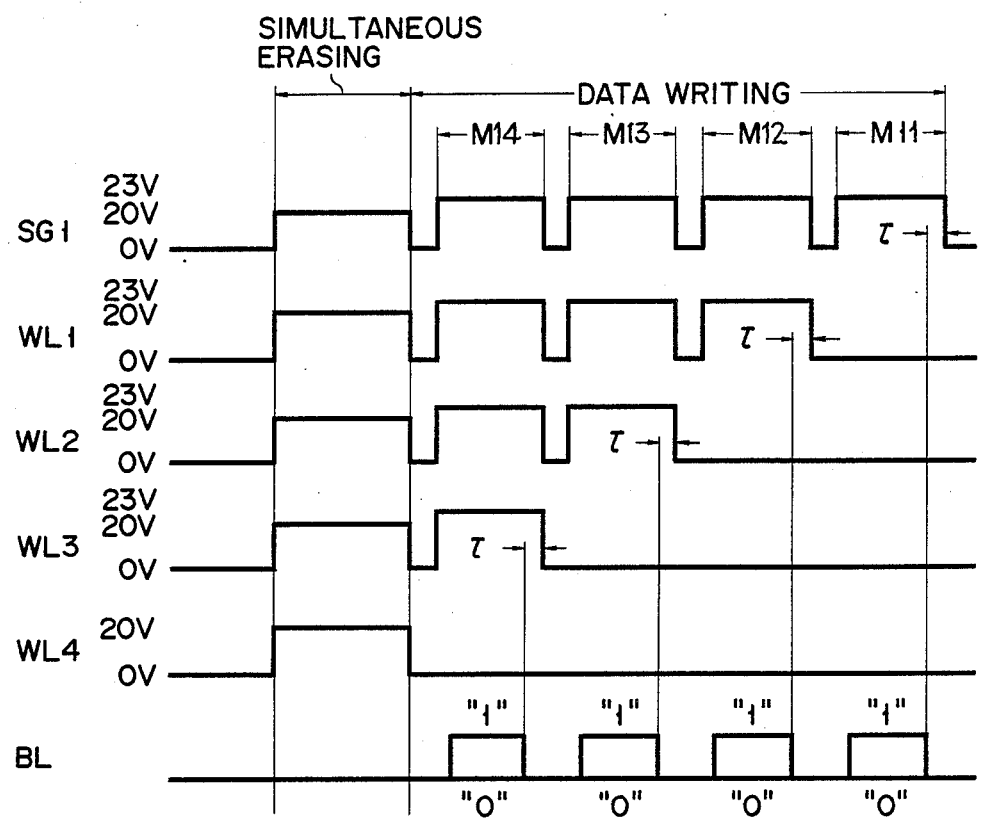
FIG. 5 illustrate waveforms of main electrical signals appearing at main portions of the EEPROM of FIG. 1 during its simultaneous erase mode and subsequent data write mode.

The simultaneous erase operation of the EEPROM constructed as described above will be described with reference to the waveform diagram of FIG. 5 as well. Prior to writing into a desired selected memory cell, the EEPROM is arranged to simultaneously erase all the memory cells M (the simultaneous erase mode). To this end, as shown in FIG. 5, a "H" level potential (e.g. 20 volts) is applied to gate control line SG1 (i.e. terminal SD1) so that selection transistors Qs11, Qs21, ... Qsm1 are rendered conductive and NAND cell blocks B11, B21, ..., Bm1 are thus connected to corresponding bit lines BL1, BL2, ..., BLm, respectively. Under these conditions bit lines BL1, BL2, ..., BLm are supplied with a "L" level potential (e.g. 0 volts), while word lines WL1 through WL4 (i.e. control gate line terminals CG1 through CG4) are supplied with a "H" level potential. As a result, an electric field is generated between substrate 10 and control gate 32 of each of all the memory cells M so that electrons are injected from substrate 10 into the floating gates of all the memory cell transistors due to Fowler-Nordheim tunneling (abbreviated to "F-N tunneling"). The threshold of each memory cell transistor is shifted in positive to, for example, 2 V so that all the memory cells are placed in the erase state. The substrate potential Vs is 0 V.

The EEPROM is subsequently set to a data write mode. Gate control line SG1 and word lines WL1 through WL4 are reset to 0 V immediately after the mode is changed over as shown in FIG. 5. Assuming that NAND cell block B11 is specified or selected, memory cells M11 through M14 of NAND cell block B11 are sequentially written into in the following manner: memory cell M14, which is positioned most distant from an electrical connection node (which may be considered to be selection transistor Qs11) between NAND cell block B11 and corresponding bit line BL1, is first subjected to data write; and subsequently memory cell M13, memory cell M12 and memory cell M11 are sequentially subjected to data write in the mentioned order.

As shown in FIG. 5, gate control line SG1 (i.e. terminal SD1) is supplied with a boosted "H" level potential (e.g. 23 volts which is boosted by the threshold voltage Vth of the memory cell in the erase state), so that selection transistor Qs11 of selected NAND cell block B11 is rendered conductive and thus NAND cell block B11 is electrically connected to corresponding bit line BL1. The application of the boosted "H" level potential to gate control line SG1 is accomplished by rendering transistor S5 conductive by application thereto of signal $\overline{PRO}$ through line CTL and by applying the boosted potential to the gate of selection transistor Qs11 that is applied to terminal SD1.

Subsequently, the boosted "H" level potential is applied to word lines WL1 through WL3 whereby the remaining memory cells M11 through M13 except memory cell M14 which is first subjected to data write are rendered conductive. The application of the increased "H" level potential to word lines WL1 through WL3 is accomplished by rendering transistors S1 through S3 conductive by application thereto of signal $\overline{PRO}$ through line CTL and by applying the boosted potential to the control gates of cell transistors M11 through M13 that is applied to terminals CG1 through CG3. In this state word line WL4 alone is supplied with a logic "L" level potential (0 volts). As a result, write data voltage (a "H" level potential in the case where the write data is a logic 1, while a "L" level potential in the case of a logic 0) supplied through bit line BL1 in a well known manner is transferred to the drain (N+ diffusion layer 22 in FIG. 4) of selected memory cell transistor M14 via the channels of selection transistor Qs11 and non-selected cell transistors M11 through M13. The control gate of transistor M14 is at 0 volts because word line WL4 is set to 0 volts Transistor M14 is thus rendered conductive. Because of the F-N tunneling electrons are tunneled back from the floating gate of transistor M14 to substrate 10 (the flow of a tunnel current). The threshold of transistor M14 is shifted to, for example, −2 volts in the negative direction with the result that logic "1" data is written into selected memory cell M14. During this interval, since no electric field is generated between the control gate of each of non-selected cells M11 through M13 and substrate 10, non-selected cells M11 through M13 ar maintained in the erase state.

After memory cell M14 has been written into, the corresponding bit line BL1 is forced down to a logic "0" level before lines SG1 and WL1 through WL4 are temporarily dropped to ground potential (substrate potential) Vs. The time difference is indicated by "τ" in FIG. 5. As a result, the potential at the node between selected memory cell M14 and nonselected memory cell M13 adjacent to M14 can be decreased during interval τ. This will make some contribution to suppression of the variation of the threshold of memory cells M.

Subsequently, data is written into memory cell M13. To this end, corresponding word line WL3 is set to a "L" level potential (0 volts). At this time word line WL4 connected to memory cell M14 into which data has been written is continuously maintained at the "L" level potential. The above data write operation is sequentially repeated in the order of cells M13, M12 and M11, thus completing the data write operation for selected NAND cell block B11.

Where selected memory cell M14 of NAND cell block B11 is to be rewritten into, the data write operation using the simultaneous erasing and the writing technique is performed again. Nonselected memory cells M11 through M13 are continuously maintained in the erase state while the data write operation for selected memory cell M14 is repeated. When selected memory cell M14 is repeatedly subjected to data write/erase, the threshold value of nonselected memory cells M11 through M13 of cell block B11 gradually increases as the number of the rewrite operations for selected memory cell M14 increases as shown in FIG. 6. Such undesirable increase in the threshold value of the nonselected cells is due to the fact that the nonselected memory cells are repeatedly subjected to the erase operation only without being written into.

According to the EEPROM of the present invention, therefore, in a simultaneous erase mode performed prior to the normal data write operation, memory cells M11 through M14 of NAND cell block B11 including selected memory cell M14 are all subjected to a write operation, which is distinct from the normal write operation and thus called "auxiliary write operation" or "write operation for threshold control" in the following description. The auxiliary write operation will be detailed by reference to the waveform diagram of FIG. 7 hereinafter.

Figure 7:
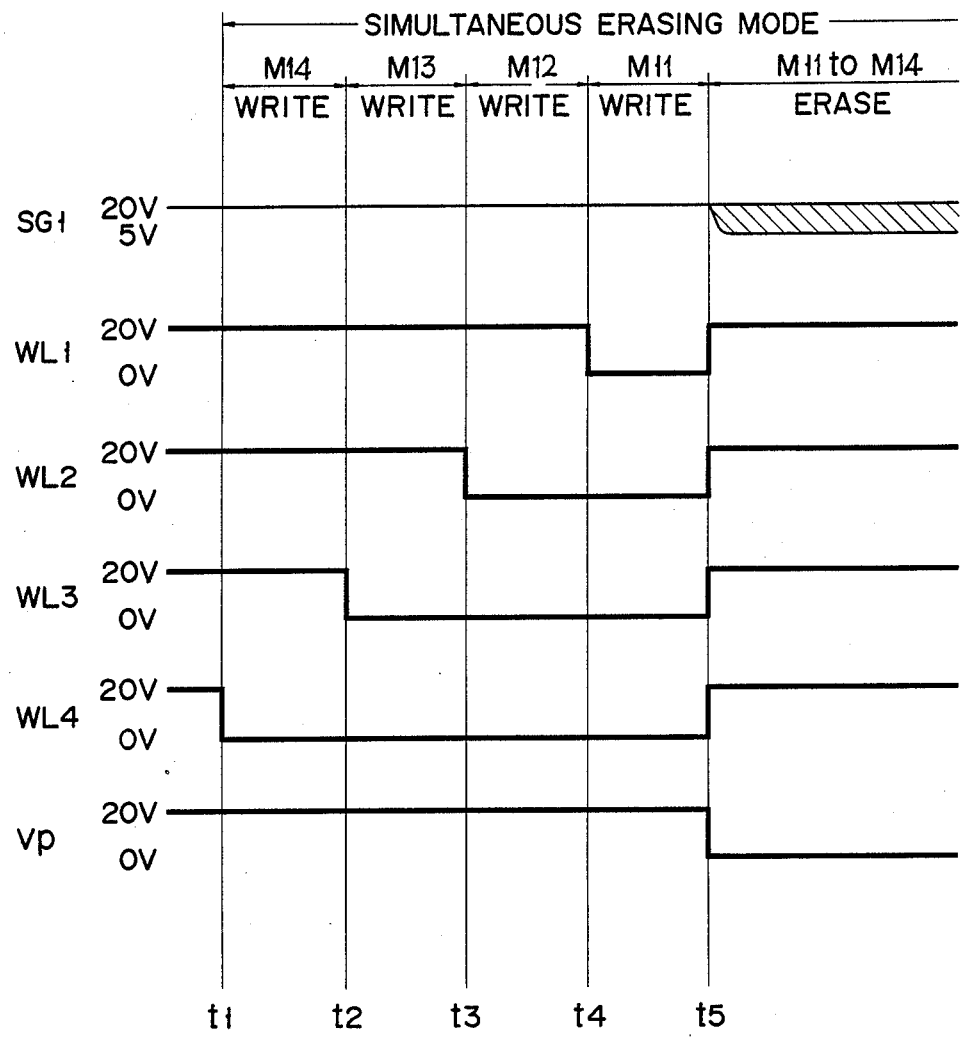
FIG. 7 illustrates waveforms of main electrical signals appearing in main portions of the EEPROM of FIG. 1 at the time of auxiliary writing (writing for preventing the threshold variation) carried out during a simultaneous erase mode of the EEPROM.

As shown in FIG. 7, during the simultaneous erase mode, before all the memory cells M11 through M14 of selected NAND cell block B11 are simultaneously erased, memory cells M11 through M14 are first subjected to the auxiliary write operation in sequence. More specifically, when the EEPROM is set to the simultaneous erase mode at time t1, a "L" level potential (0 volts) is applied to word line WL4 (terminal CG4) in order to write into memory cell M14 which is most distant from a point (which may considered to be selection transistor Qs11) of connection with corresponding bit line BL1 among memory cells M11 through M14 of NAND cell block B11. At this time control gate line SG1 is supplied with a "H" level potential (20 volts) and thus NAND cell block B11 is connected to bit line BL1 via selection transistor Qs1 which is rendered conductive. The remaining memory cell transistors M11 through M13 are rendered conductive. Since a "H" level potential (20 volts) is applied to word lines WL1 through WL3, transistor T1 is rendered conductive by column decoder 50, and a voltage Vp for auxiliary writing (corresponding to a logic "1" level voltage) is applied to bit line BL under the control of control circuit 52. As a result, the drain voltage (i.e. the voltage at N+ layer 22 in FIG. 4) of memory cell M14 goes to a "H" level potential (20 volts) and thus data "1" is written into M14 during interval between t1 and t2. Electrons are discharged from the floating gate of memory cell M14 into substrate 10 in accordance with the writing mechanism which is essentially the same as the normal data writing described above, with the result that the threshold of memory cell M14 becomes about −3 volts. Afterward the auxiliary write operation is sequentially performed in the order of memory cell M13 (during interval between t2 and t3), memory cell M12 (during interval between t3 and t4) and memory cell M11 (during interval between t4 and t5) and is completed at t5.

At time t5 when the auxiliary write operation is completed, a "H" level potential (20 volts) is applied to all the word lines WL1 through WL4 of NAND cell block B11 and the source and drain voltages of each of memory cells M11 through M14 ar set to ground potential Vs so that all the memory cells M11 through M14 of NAND cell block B11 are subjected to the simultaneous erase which is the main operation of this erase mode. At this time memory cells M11 through M14 are uniformly set to 1∼3 volts in their threshold value owing to the auxiliary write operation. This can surely avoid over-erasing nonselected cells M11 through M14 and can thus eliminate the undesirable incremental variation of the threshold values of the nonselected memory cells. Hence, the occurrence of failures during the subsequent read operation of the NAND cell type EEPROM can be avoided, providing high operational reliability of the EEPROM.

The simultaneous erase that is the main operation in the erase mode may be performed at time t5 by: (1) causing transistors S1 through S5 to be rendered conductive; (2) applying a "H" level potential to the control gates of all of memory cells M, inclusive of memory cells M11 through M14 of NAND cell block B11; (3) applying a "H" level potential to gate control line SG1 so as to render selection transistor Qs11 conductive; and (4) applying a "L" level potential corresponding to a logic "0" to bit lines BL. At this time electrons are injected from substrate 10 into the floating gates of all the cells M so that they are placed in the erase state.

Figure 8A:
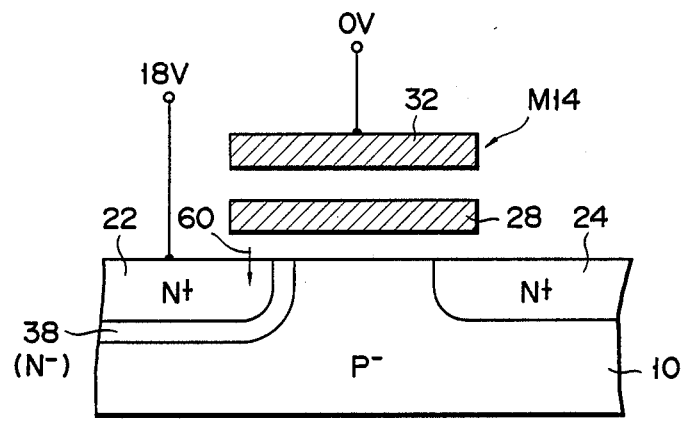
FIG. 8A is a diagram showing the mechanism of tunneling of electrons in a certain memory cell during the auxiliary writing.

FIG. 8A illustrates the transfer of electrons at the time of the auxiliary write operation performed during the simultaneous erase mode taking the case of memory cell M14 by way of example. As described above, since the coupling capacitance Cfs between floating gate 28 and substrate 10 is smaller than coupling capacitance Cfc between floating gate 28 and control gate 32, electrons accumulated at floating gate 28 of cell transistor M14 are tunneled back to substrate 10 through gate insulating layer 30 (as shown in FIG. 3). As indicated by an arrow 60 in FIG. 8A, the transfer of the electrons occurs mainly between floating gate 28 and N+ drain diffusion layer 22. In FIG. 8A, the reason why the voltage impressed to N+ diffusion layer 28 is indicated as "18 V" is that the bit line voltage Vp is dropped in voltage by the threshold voltage of selection transistor Qs11 and then transferred to cell M14. Consequently the threshold voltage of the transistor becomes negative. This means that logic "1" data has been written into memory M14.

Figure 8B:
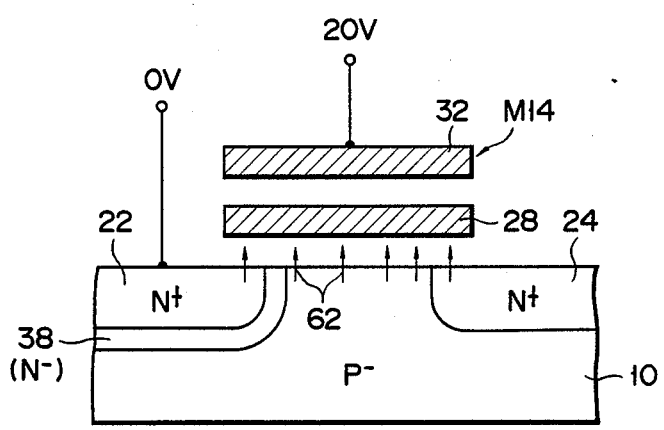
FIG. 8B is a diagram showing the mechanism of tunneling of electrons in a certain memory cell during the simultaneous erase.

FIG. 8B illustrates the transfer of electrons at the time of the data erase performed during the simultaneous erase mode taking the case of memory cell M14 by way of example. N+ diffusion layer 22 of M14 is placed by the above described voltage application at ground potential Vs (0 volts) and control gate 32 thereof is set to a "H" level potential (20 volts). An intense electric field is thus generated between control gate 32 and substrate 10. Due to the electric field electrons are injected from substrate 10 to floating gate 28 as indicated by arrows 62.

Figure 9:
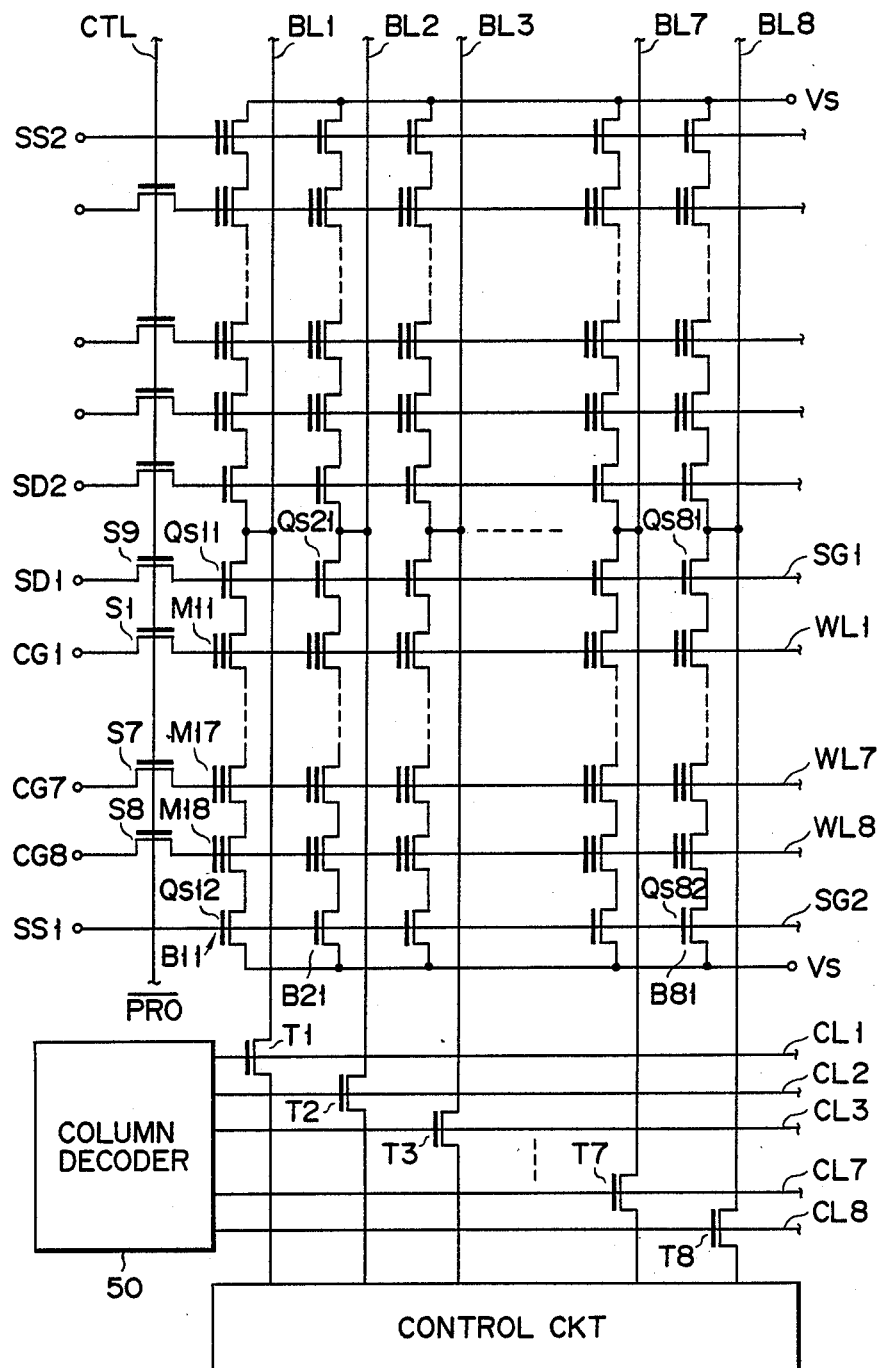
FIG. 9 is a diagram showing principal part of a circuit arrangement of an electrically erasable programmable read-only memory according to another embodiment of the invention.
Figure 10:
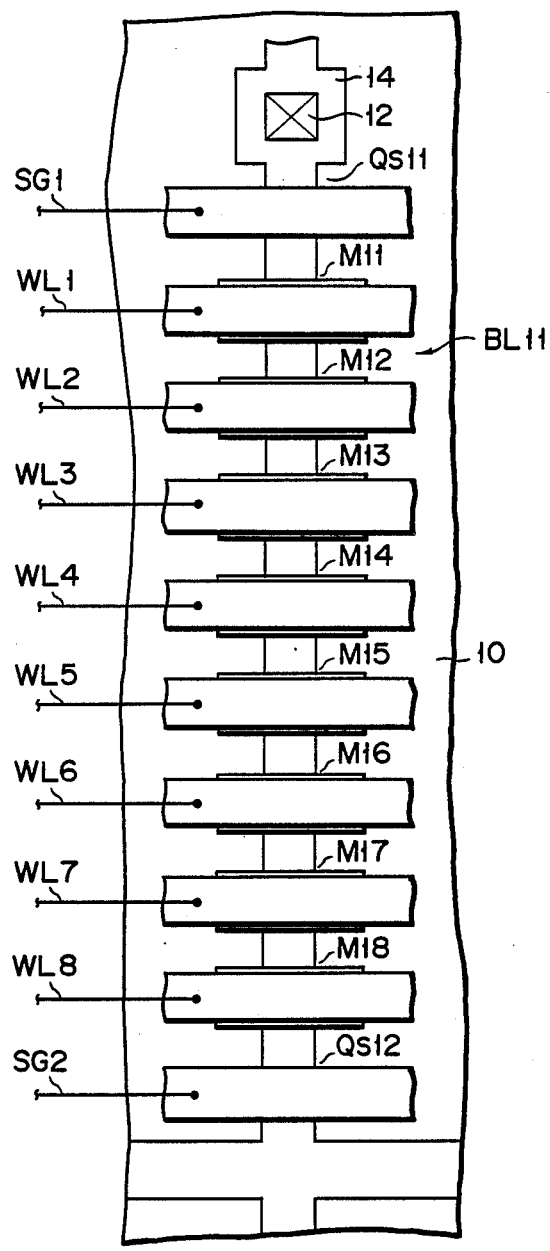
FIG. 10 is a plan view of a NAND cell block provided in the EEPROM of FIG. 9 and including memory cell transistors series connected with first and second selection transistors so as to constitute a NAND cell structure.

Referring now to FIG. 9, in an electrically erasable programmable read-only memory according to a second embodiment of the invention, each NAND cell block Bi1 has eight memory cells M the sectional structure of each of which is the same as that in the first embodiment. The plan view of each NAND cell block is shown in FIG. 10 in the same manner as in FIG. 2. Each of NAND cell blocks has selection transistors Qs1, Qs2 and a selected number of memory cells M. Selection transistors Qs are each formed of a single-gate MOSFET. More specifically, the transistor series combination in each NAND cell block Bi1 has one end (i.e. the drain of cell transistor M11) connected to corresponding bit line BLi via first selection transistor Qsi1 and the other end (i.e. the source of cell transistor M14) connected to ground potential Vs via second selection transistor Qsi2.

Word lines WL1 through WL8 ar connected to control gate terminals CG1 through CG9, respectively, via corresponding transistors S1 through S8 having gates connected together to control line CTL. Gate control line SG1 connected to the gates of first selection transistors Qs11, Qs21, ..., Qs81 are connected to terminal SD1 via transistor S9 having its gate connected to control line CTL. Second gate control line SG2 connected to the gates of second selection transistors Qs12, Qs22, ..., Qs82 is directly connected to terminal SS1. Bit lines BL1 through BL8 are connected to control circuit 52 via transistors T1 through T8, respectively. Transistors T1 through T8 are connected at their gates to column lines CL1 through CL8, respectively, which in turn are connected to column decoder 50.

With such an arrangement, when, for example, NAND cell block B11 is specified as a cell block including a selected memory cell during a normal data write mode, second selection transistor Qs12 of NAND cell block B11 is rendered conductive in response to application of a "H" level potential thereto through line 32. At this time, since first selection transistor Qs11 has also been rendered conductive, selected NAND cell block B11 is connected at its end (the drain of cell M11) to corresponding bit line BL1 associated therewith and at the other end (the source of cell M18) to substrate potential (i.e. ground potential Vs). Under these conditions data is written into the selected cell in the same manner as described above. In the simultaneous erase mode of the EEPROM, second selection transistor Qs12 in NAND cell block B11 is rendered nonconductive in response to application of a "L" level potential signal thereto through line SG2, thereby electrically disconnecting cell block B11 from substrate potential Vs.

First and second selection transistors Qs11 and Qs12 in selected NAND cell block B11 are rendered conductive at the time of the auxiliary write operation performed during the simultaneous erase mode. Under these conditions, in order to write into memory cell M11 which is nearest to a point (which may be considered to be selection transistor Qs11) of connection with corresponding bit line BL1 among memory cells M11 through M18 in NAND cell block B11, a "L" level potential (0 volts) is applied to word line WL1 (terminal CG1) as shown in FIG. 11. The remaining memory cell transistors M12 through M18 are rendered conductive because word lines WL2 to WL8 are supplied with a "H" level potential (20 volts). As a result, the auxiliary write operation is first carried out on cell M11 during interval between t1 and t2. Subsequently, as shown in FIG. 11, memory cells M12, M13, ..., M18 are in this sequence subjected to the auxiliary write operation in the same manner as above. The auxiliary write operations for all the memory cells M11 through M18 in cell block B11 are completed at time t9. Afterward the simultaneous erase is carried out as in the previous embodiment.

Thus, by temporarily writing logic "1" data into all the memory cells M in NAND cell blocks B prior to the simultaneous erase, it becomes possible to surely avoid the undesirable incremental variation of the threshold voltage of nonselected cells which might occur when data is repeatedly written into a selected cell. Moreover, according to this embodiment, memory cells M11 through M18 are sequentially subjected to the writing of logic "1" data in the order of M11, M12, ..., M18 at the time of auxiliary write operation. Hence the auxiliary write operation can be carried out more easily and its efficiency can be improved.

At time t9 when the auxiliary write operation is completed, a "H" level potential (20 volts) is applied to all the word lines WL1 through WL4 in NAND cell block B11 and the source and drain of each of memory cells M11 through M18 are set to ground potential Vs so that all of memory cells M11 through M18 in NAND cell block B11 are subjected to the simultaneous erase, the main operation in the erase mode. At this time, second selection transistor Qs12 is rendered nonconductive to electrically disconnect the series array of cell transistors in NAND cell block B11 from substrate potential Vs. This will contribute t avoidance of failures in the simultaneous erase operation.

What is claimed is:
1. A nonvolatile dynamic semiconductor memory device comprising:
 (a) a semiconductive substrate;
 (b) parallel bit lines provided above said substrate;
 (c) rewritable memory cells connected to said bit lines, said memory cells comprising NAND cell blocks each of which has a series array of memory cell transistors, each of said memory cell transistors having a floating gate and a control gate; and
 (d) threshold adjusting means for carrying out an auxiliary write operation on all of said memory cells before erasing data stored in said memory cells simultaneously during a erase mode of said memory device, thereby suppressing or avoiding undesirable incremental variation of a threshold value of each of said memory cell transistors.

2. The device according to claim 1, wherein, when a cell block including a selected memory cell is specified and data rewrite operation is repeatedly performed on said selected memory cell, said threshold adjusting means carries out the auxiliary write operation on all of said memory cells in said specified cell block in sequence, whereby charges are discharged from charge accumulation layers of said memory cells into said substrate so that the threshold values of said memory cell transistors are kept at a fixed potential level.

3. The device according to claim 2, wherein said threshold adjusting means carries out the auxiliary write operation on a first specific memory cell first, among said memory cells in said specified cell block, which is most distant from a corresponding bit line associated with said specified cell block, subsequently on memory cells adjacent to said first specific memory cell and lastly on a second specific memory cell which is nearest to said corresponding bit line.

4. The device according to claim 2, wherein said threshold adjusting means carries out the auxiliary writing into a first specific memory cell first, among said memory cells in said specified cell block, which is nearest to a corresponding bit line associated with said specified cell block, subsequently memory cells adjacent to said first specific memory cell and lastly a second specific memory cell which is most distant from said corresponding bit line.

5. The device according to claim 2, wherein each of said memory cell transistors has heavily-doped semiconductive layers formed in said substrate and lightly-doped semiconductive layers surrounding said heavily-doped semiconductive layers, each of said layers having a conductivity type opposite to that of said substrate.

6. A nonvolatile dynamic semiconductor memory device comprising:
(a) a semiconductive substrate;
(b) parallel bit lines formed over said substrate;
(c) rewritable memory cells connected to said bit lines, said memory cells comprising NAND cell blocks each of which has a series array of memory cell transistors, each of said memory cell transistors having a charge accumulation layer and a control gate; and
(d) simultaneous erase means for simultaneously erasing all of said memory cells by applying such a high potential as corresponds to a "H" level potential to control gates of all of said memory cells and such a low potential as corresponds to a "L" level potential to said bit lines during a data erase mode of said device, said simultaneous erase means comprising threshold reset means for initializing threshold values of said memory cells by removing charges from charge accumulation layers of all of said memory cells before said memory cells are all erased simultaneously.

7. The device according to claim 6, wherein said threshold reset means initializes said series-arrayed memory cell transistors in each of said NAND cell blocks in sequence.

8. The device according to claim 7, wherein said threshold reset means initializes the threshold values of said memory cells by tunneling electrons accumulated at charge accumulation layers of said memory cells into said substrate.

9. An erasable programmable read-only memory device comprising:
(a) a semiconductive substrate;
(b) parallel bit lines provided above said substrate;
(c) parallel word lines formed over said substrate to intersect said bit lines;
(d) double-gate field effect transistors serving as memory cells and provided at intersections of said bit lines and said word lines, said transistors including a cell array which has a series-circuit of cell transistors constituting a NAND cell block, each of said cell transistors having an electrically floating gate layer serving as a charge accumulation layer and a control gate layer connected to a corresponding word line; and
(e) erase means for performing a simultaneous erase operation to simultaneously erase all of said memory cells included in said NAND cell block by applying such a high voltage as corresponds to a "H" level to said word lines connected to control gate layers of all of said cell transistors included in said NAND cell block, said erase means comprising auxiliary writing means for temporarily writing data into said memory cells in said NAND cell block in a predetermined sequence prior to the simultaneous erase operation by discharging electrons from charge accumulation layers of said memory cells into said substrate, so that threshold values of said memory cells in said NAND cell block are kept at a fixed potential level.

10. The device according to claim 9, wherein said auxiliary writing means comprises:
voltage supply means for applying, when a memory cell in said NAND cell block is subjected to the auxiliary write operation, a "L" level potential to said control gate layer of said memory cell, a "H" level potential to control gate layers of the remaining memory cells in said NAND cell block and a voltage corresponding to logic "1" data to said corresponding bit line.

11. The device according to claim 10, wherein said NAND cell block includes a field effect transistor with a gate layer, serving as a first selection transistor for selectively connecting said NAND cell block at its one end to a corresponding bit line associated therewith; and wherein said voltage supply means renders said first selection transistor conductive at the time of the auxiliary write operation so as to electrically connect said NAND cell block to said corresponding bit line.

12. The device according to claim 11, wherein said NAND cell block includes a field effect transistor with a gate layer, serving as a second selection transistor for selectively connecting said NAND cell block at the one end thereof to a substrate potential, said second selection transistor being rendered nonconductive when the simultaneous erase operation is carried out, so as to electrically disconnect said NAND cell block from said substrate potential.

13. The device according to claim 12, wherein said charge accumulation layer comprises a floating gate and wherein a coupling capacitance between said floating gate and said substrate is smaller than a coupling capacitance between said floating gate and said control gate.

14. The device according to claim 12, wherein said auxiliary writing means carries out the auxiliary write operation on said memory cells in said NAND cell block sequentially in such a manner that the auxiliary write operation starts with a memory cell adjacent to said second selection transistor among said memory cells in said NAND cell block and ends with a memory cell adjacent to said first selection transistor.

15. The device according to claim 12, wherein said auxiliary writing means carries out the auxiliary write operation on said memory cells in said NAND cell block sequentially in such a manner that the auxiliary write operation starts with a memory cell adjacent to said first selection transistor among said memory cells in said NAND cell block and ends with a memory cell adjacent to said second selection transistor.

* * * * *